United States Patent
Terzioglu et al.

(10) Patent No.: US 7,440,311 B2
(45) Date of Patent: Oct. 21, 2008

(54) SINGLE-POLY NON-VOLATILE MEMORY CELL

(75) Inventors: Esin Terzioglu, Aliso Viejo, CA (US);
Gil I. Winograd, Aliso Viejo, CA (US);
Morteza Cyrus Afghahi, Coto De Caza, CA (US)

(73) Assignee: Novelics, LLC, Aliso Viejo, CA (US)

( * ) Notice: Subject to any disclaimer, the term of this patent is extended or adjusted under 35 U.S.C. 154(b) by 0 days.

(21) Appl. No.: 11/536,524

(22) Filed: Sep. 28, 2006

(65) Prior Publication Data

US 2008/0083942 A1   Apr. 10, 2008

(51) Int. Cl.
*G11C 11/24* (2006.01)

(52) U.S. Cl. ............. 365/149; 365/185.26; 365/185.14; 365/185.29

(58) Field of Classification Search ................. 365/149, 365/185.26, 185.14, 185.29
See application file for complete search history.

(56) References Cited

U.S. PATENT DOCUMENTS

| | | | | |
|---|---|---|---|---|
| 5,844,271 A | * | 12/1998 | Sethi et al. | 257/318 |
| 5,981,335 A | * | 11/1999 | Chi | 438/253 |
| 6,137,315 A | * | 10/2000 | Zettler | 326/83 |
| 6,256,225 B1 | * | 7/2001 | Noble et al. | 365/185.05 |
| 6,297,989 B1 | * | 10/2001 | Cloud et al. | 365/185.08 |
| 6,452,856 B1 | * | 9/2002 | Forbes et al. | 365/230.06 |
| 6,528,842 B1 | * | 3/2003 | Luich et al. | 257/315 |
| 6,631,087 B2 | * | 10/2003 | Di Pede et al. | 365/185.18 |
| 6,731,541 B2 | * | 5/2004 | Kinsey et al. | 365/185.18 |
| 6,741,519 B2 | * | 5/2004 | Forbes et al. | 365/230.06 |
| 6,806,529 B1 | * | 10/2004 | Hopper et al. | 257/314 |
| 6,809,985 B2 | * | 10/2004 | Forbes et al. | 365/230.06 |
| 2002/0191439 A1 | * | 12/2002 | Caywood | 365/185.06 |
| 2003/0142548 A1 | * | 7/2003 | Huang et al. | 365/185.26 |
| 2003/0191439 A1 | * | 10/2003 | Chaffringeon | 604/287 |
| 2004/0084712 A1 | * | 5/2004 | Lin et al. | 257/314 |

\* cited by examiner

*Primary Examiner*—Huan Hoang
*Assistant Examiner*—Jay Radke
(74) *Attorney, Agent, or Firm*—Jonathan W. Hallman; MacPherson Kwok Chen & Held LLP

(57) ABSTRACT

A non-volatile memory cell includes a floating gate transistor having a floating gate coupled to a metal layer capacitor defined in one or more metal layers. Within each metal layer, the metal layer capacitor includes a first plate coupled to the floating gate and a second plate separated from the first plate by a fringe capacitance junction.

8 Claims, 4 Drawing Sheets

SINGLE-POLY NON-VOLATILE MEMORY CELL

TECHNICAL FIELD

This application relates generally to non-volatile memory, and more particularly to a non-volatile memory in which a floating gate is programmed and erased using fringe capacitance.

BACKGROUND OF THE INVENTION

Non-volatile memory cells include a floating gate in which electric charge may be injected. As implied by the name, the floating gate electrically "floats" with regard to other structures in the cell such that the injected charge is retained even if the memory cell is powered down. In a classic non-volatile memory cells, two separate polysilicon layers are required. A first polysilicon layer forms the floating gate. A second overlaying polysilicon layer forms a control gate that is used to program the floating gate. Because CMOS semiconductor manufacturing processes provide only a single polysilicon layer, "single-poly" non-volatile memory cells have been developed in which the control gate is formed as a buried diffusion region.

Although conventional single-poly non-volatile memory cells are compatible with CMOS manufacturing processes, the buried diffusion area occupies die area and thus decreases device density, thereby increasing manufacturing costs. Moreover, the buried diffusion region is prone to junction breakdown. To increase density, single-poly non-volatile memory cells have been developed in which the control gate is implemented as a trench metal-insulator-metal (MIM) capacitor. However, forming a trench MIM capacitor demands extra processing steps and thus also increases costs.

Accordingly, there is a need in the art for improved non-volatile memory cells.

SUMMARY

This section summarizes some features of the invention. Other features are described in the subsequent sections.

In accordance with an embodiment of the invention, a non-volatile memory cell, is provided that includes: a substrate including diffusion regions for a floating gate transistor; and a capacitor adjacent the substrate formed in at least one metal layer such that within each at least one metal layer, the capacitor include a first plate coupled to a floating gate for the floating gate transistor and a second plate separated from the first plate by a fringe capacitance junction.

In accordance with another aspect of the invention, a memory array is provided that includes: a substrate including diffusion regions for a plurality of floating gate transistors; the floating gate transistors being arranged in rows; a plurality of metal conductors corresponding to each row, each metal conductor being defined in at least one metal layer adjacent the substrate; and wherein each floating gate transistor couples to a capacitor formed by a plurality of plates in the at least one metal layer arranged such that each plate lies between the metal conductors for the row including the floating gate transistor.

In accordance with another aspect of the invention, a method of programming an NMOS non-volatile memory cell having a floating gate transistor including a terminal coupled to an erase line and a floating gate coupled to a metal layer capacitor, comprises: grounding the erase line; and charging the metal layer capacitor to a positive programming voltage such that the voltage coupled from the metal layer capacitor through a fringe capacitance junction to the floating gate to program the non-volatile memory cell.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
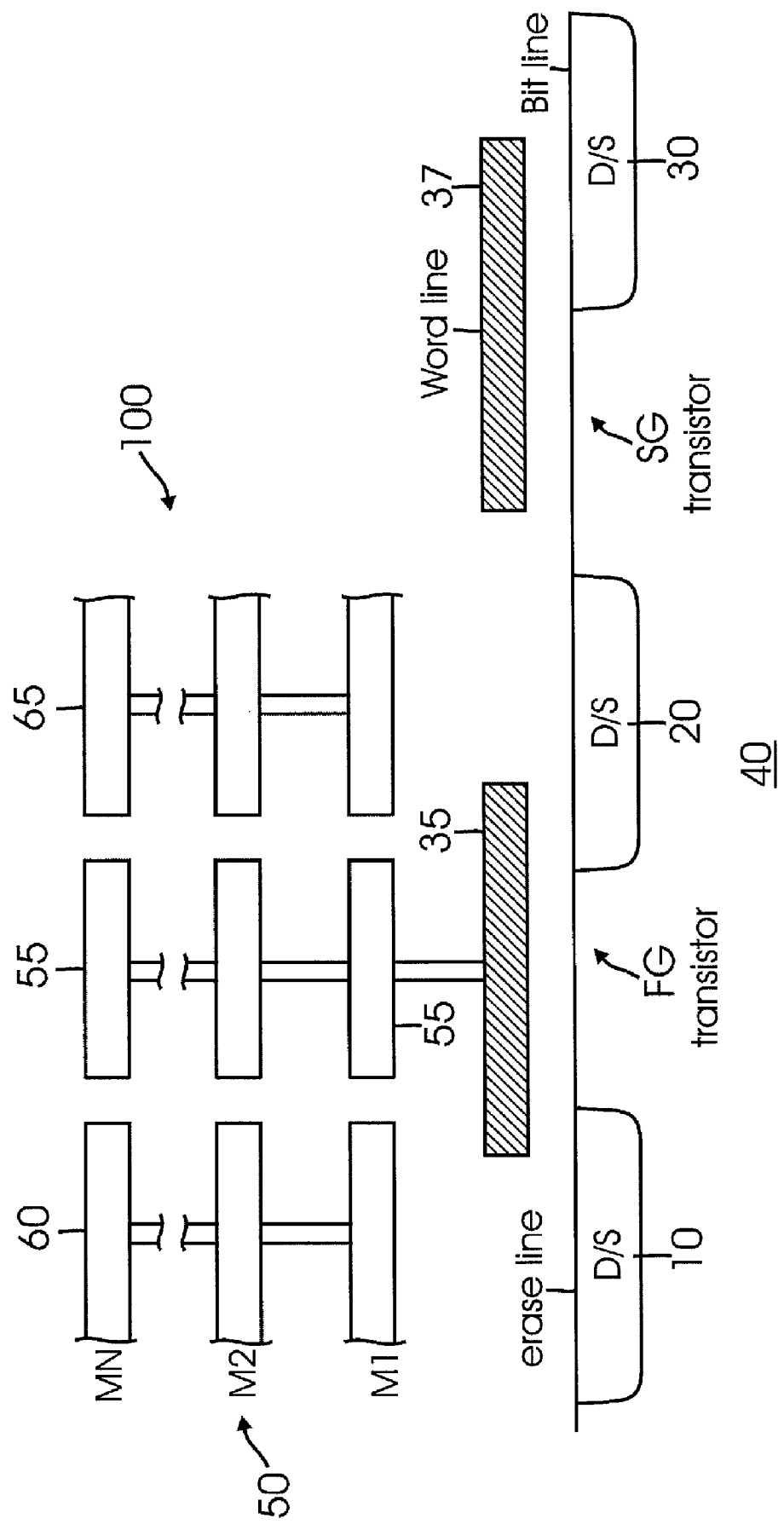
FIG. 1 is a cross-sectional view of a single-poly non-volatile memory cell in which a metal layer capacitor functions as the control gate in accordance with an embodiment of the invention.

Turning now to the drawings, FIG. 1 illustrates a non-volatile memory cell 100 in which the control gate is formed using semiconductor metal routing layers M1 through MN. These metal routing layers are already present in conventional CMOS semiconductor manufacturing techniques such that the formation of memory cell 100 is entirely compatible with such techniques. It will be appreciated, however, that memory cell 100 may be formed in other types of semiconductor manufacturing processes using whatever metal routing layers are available.

The memory cell includes a floating gate (FG) transistor and a select gate (SG) transistor. The floating gate transistor is formed using a first diffusion region 10 and a second diffusion region 20 separated by a channel (not illustrated) that may be induced under a floating gate 35. The floating gate may be formed in the single polysilicon layer provided in CMOS manufacturing processes. The same polysilicon layer forms a select gate 37 for the select gate transistor which may induce a channel to join diffusion region 20 with a third diffusion region 30.

The diffusion regions have a conductivity type that is complementary to that for a substrate 40. For example, if the memory cell is an NMOS memory cell, the diffusion regions are doped n-type whereas the substrate is doped p-type. Conversely, if the memory cell is a PMOS memory cell, the diffusion regions are doped p-type whereas the substrate is doped n-type. Because the source and drain locations are reversed depending upon whether a cell is an NMOS or PMOS cell, the diffusion regions are labeled "drain/source" (D/S) for generality.

The disclosed memory cell shares a number of features in common with conventional single-poly designs. For example, diffusion region 10 couples to an erase line whereas diffusion region 30 couples to a bitline. A wordline couples to the select gate. However, the control gate is not formed from either a buried diffusion region or a MIM capacitor. Instead, a metal-layer capacitor 50 formed in metal layers M1 through MN functions as the control gate. The metal layer capacitor has a first plate "stack" coupled to the floating gate and a second plate stack isolated from the first stack by at least one fringe capacitance junction. As used herein, "plate" denotes the planar structure resulting from the available metal layer— the planar structure may have a rectangular shape or any other suitable topology such that these different shapes may all be generically referred to as plates because they are defined by the planar metal layer. Whether a plate stack serves as an anode or cathode for the metal layer capacitor depends upon the voltage applied to the second plate stack. In an NMOS embodiment, the second plate stack is coupled to a positive programming voltage source and thus serves as the cathode. The following discussion will assume that a plate stack 55 coupled to the floating gate serves as an anode. However, it will be appreciated that the designation of anode or cathode is arbitrary in that the plate stacks can have the same structure for either PMOS or NMOS embodiments. The cathode is formed using either of or both of opposing plate stacks 60 and 65.

Because the metal layers Ml through MN were already available in the semiconductor process, no special manufacturing steps are needed such that manufacturing costs are minimized. Moreover, the fringe capacitance is enhanced as the semiconductor technology continues to advance into the deep sub-micron regime. As the semiconductor technology advances, the fringe capacitance increases because the separation between plates on any given metal layer can be decreased.

Figure 2:
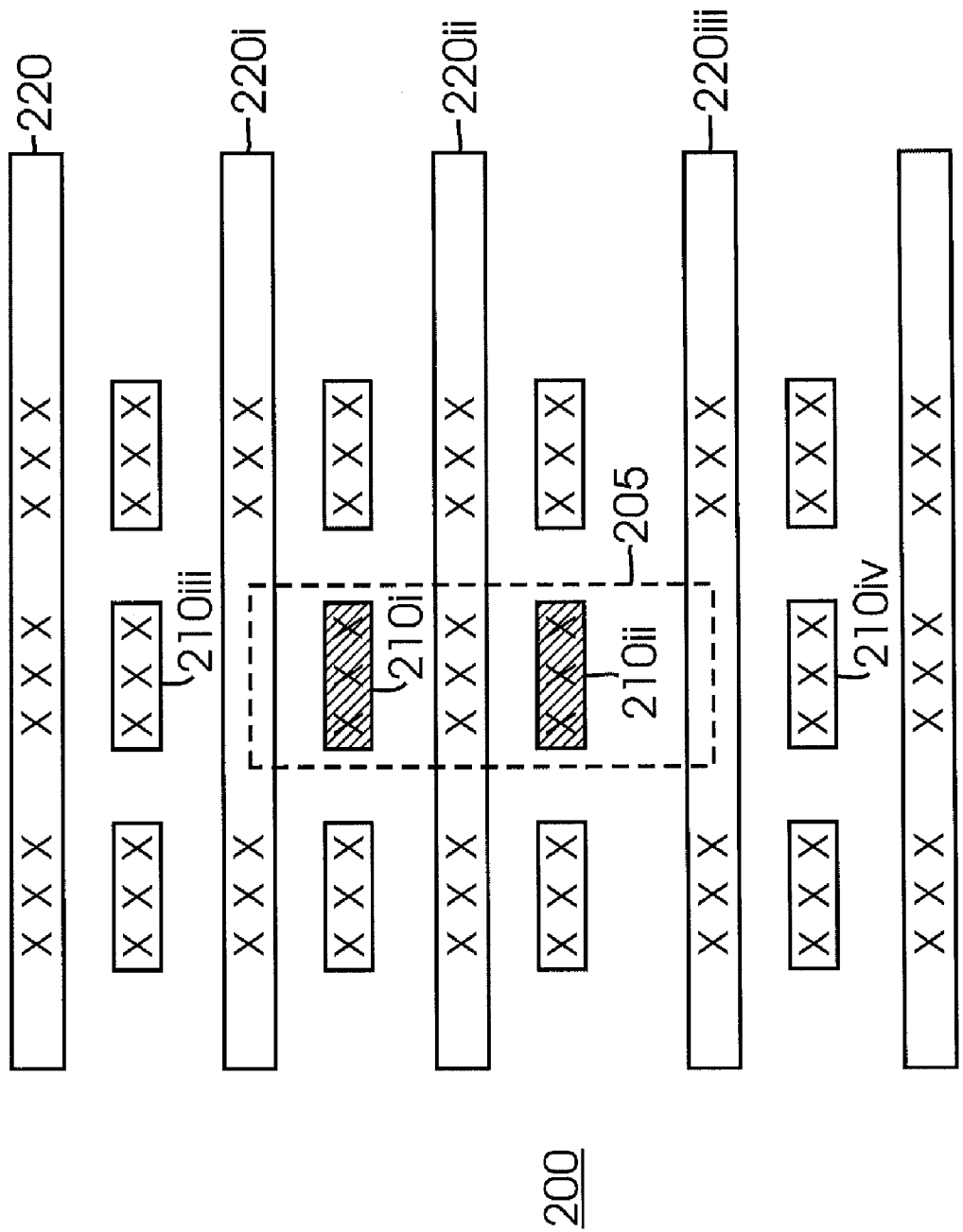
FIG. 2 is a plan view of a single-poly non-volatile memory array in accordance with an embodiment of the invention.
Figure 3:
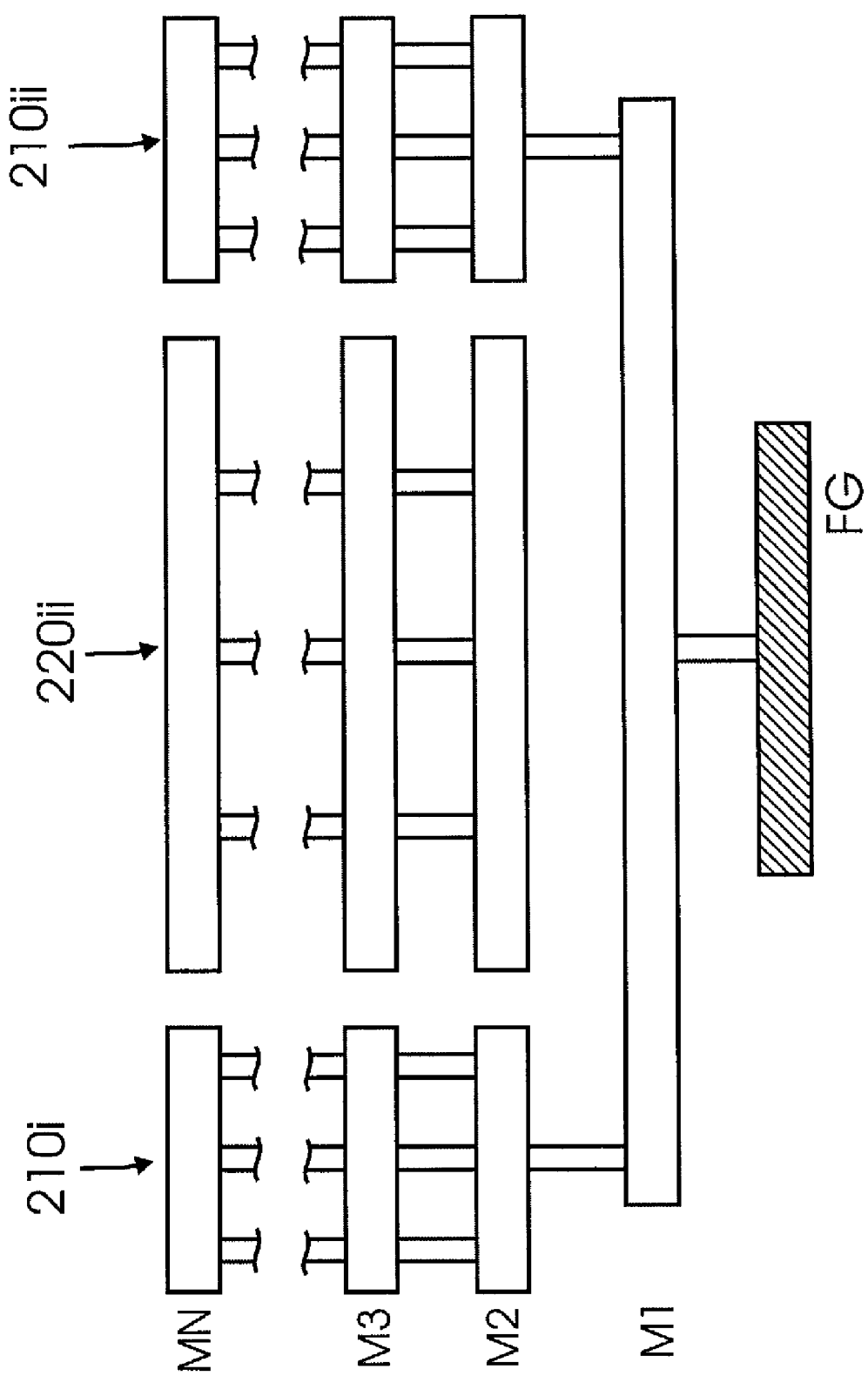
FIG. 3 is a cross-sectional view of a metal layer capacitor for a memory cell in the array of FIG. 2.

It will be appreciated that a metal layer capacitor can be manufactured in a number of topologies. For example, because the fringe capacitance is a function of the length of the junction between the anode and cathode in any given metal layer, it will be appreciated that designs that increase this contact length will provide an enhanced capacitance. The resulting enhanced capacitance ensures that a programming voltage will couple sufficiently through the metal layer capacitor to the floating gate. Turning now to FIG. 2, a nonvolatile array 200 of memory cells 205 includes two anodes 210 per memory cell. A first anode 210*i* has two fringe capacitance junctions with cathodes formed as metal conductor lines 220*i* and 220*ii*. A second anode 210*ii* also has a fringe capacitance junction with metal line 220*ii* as well as with a third metal line 220*iii*. Both the anodes and the metal lines are constructed from via-connected plate stacks as seen in the cross-sectional view of FIG. 3. Of the three metal lines, only metal line 220*ii* is illustrated in FIG. 3 for clarity. Anodes 210*i* and 210*ii* are coupled through a conductive trace in a metal layer such as M2 which in turn couples through one or more vias to the floating gate (FG). The anodes and the metal lines are thus formed using the remaining metal layers M3 through MN. Should the metal lines be formed using only metal layers M3 through MN, word line and bit lines may be constructed in the unused space left in metal layers M1 and M2.

By incorporating two anodes separated by a cathode and book-ended by two other cathodes, memory cell 205 has four fringe capacitance junctions: one between metal line 220*i* and anode 210*i*, another between anode 210*i* and metal line 220*ii*, another between metal line 220*ii* and anode 210*ii*, and one more between anode 210*ii* and metal line 220*iii*. Unlike a MIM capacitor, this fringe capacitance is increased in a three-dimensional fashion by incorporating multiple plates in each plate stack (i.e., using multiple metal layers). Not only is the capacitance per unit area much greater than an MIM capacitor, but the formation of a metal layer capacitor is entirely compatible with conventional CMOS semiconductor processes. In contrast, a MIN capacitor requires additional semiconductor process steps that are not compatible with conventional CMOS techniques.

Figure 4:
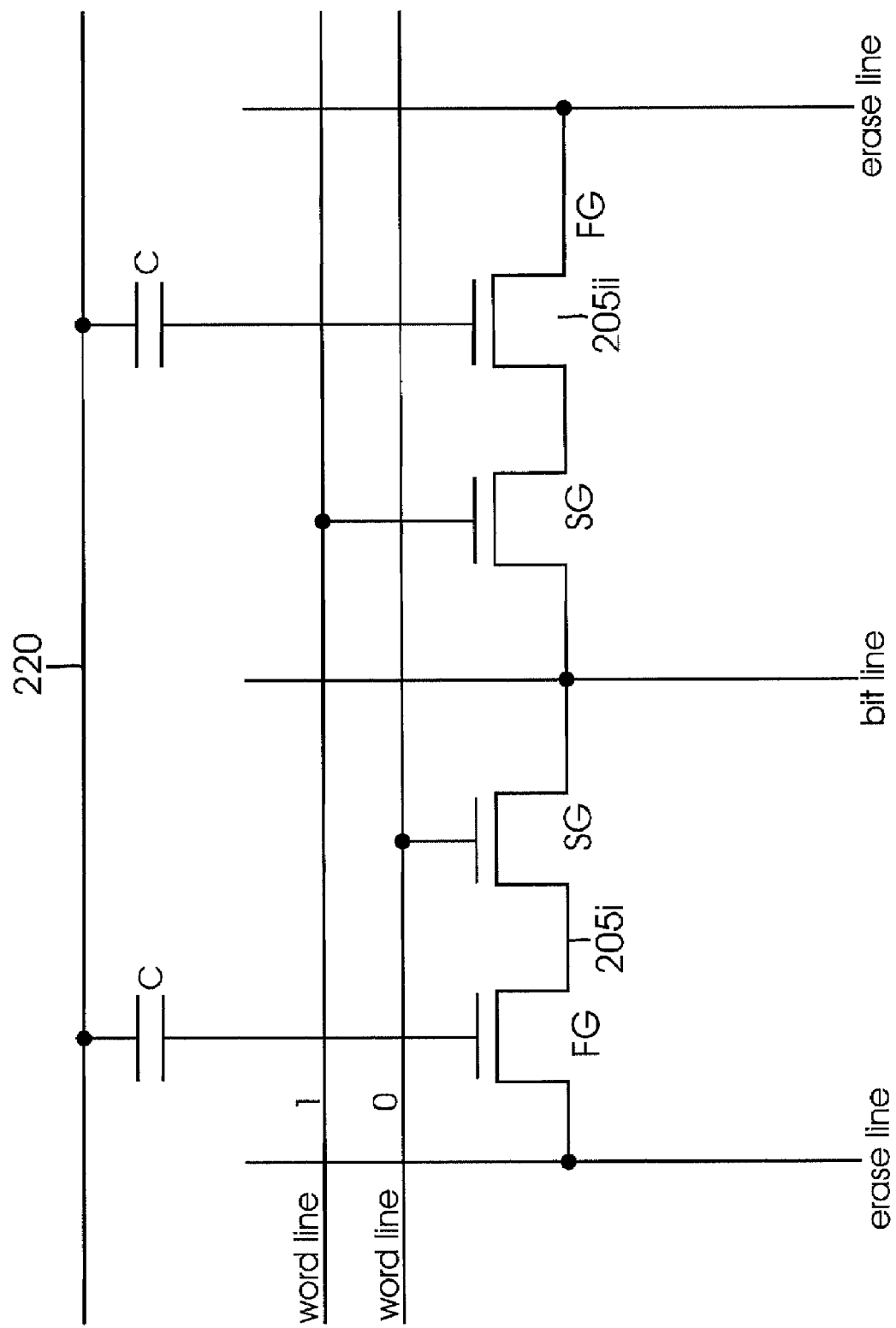
FIG. 4 is a schematic illustration of two memory cells from a memory cell row in the array of FIG. 2.

A schematic illustration for two memory cells 205*i* and 205*ii* from array 200 is illustrated in FIG. 4. These cells are arranged in a row as defined by the metal lines, which for illustration clarity are condensed into a single metal line 220. The metal layer capacitors are represented by capacitors C, which couple between the metal line and the floating gates for the floating gate (FG) transistors. By interleaving a wordline 1 and a wordline 0, cells 205*i* and 205*ii* share a single bit line, which couples to the select gate (SG) transistors as discussed with regard to FIG. 1. Each memory cell also couples to an erase line as also discussed with regard to FIG. 1. The arrangement of cells 205*i* and 205*ii* is repeated across the row such that the erase line is shared with neighboring memory cells (not illustrated). Wordline 0 drives the select gate for memory cell 205*i* whereas wordline 1 drives the select gate for memory cell 205*ii*.

Programming cells 205 is now discussed with regard to an NMOS flash embodiment, the programming for PMOS embodiments being conducted in an analogous fashion. Referring to both FIGS. 2 and 4, the three metal lines 220 corresponding to a row of memory cells are coupled to a programming voltage source while the erase lines at the sources of the floating gate transistors are grounded. In this fashion, Fowler Nordheim tunneling of electrons occurs to charge the floating gates without requiring any channel current, thereby saving power. It will be appreciated that an analogous "hot electron" programming may be performed in which channel currents are induced. Although hot electron programming is faster, the resulting channel currents consume substantially more power than Fowler Nordheim programming. A selective programming of desired memory cells within a row may be performed by keeping the erase lines for the not-to-be-programmed cells at an intermediate or high voltage. The metal lines for rows that are not being programmed should be kept at an intermediate voltage so that the cells on those rows will not be programmed regardless of the state of the erase lines.

As seen in FIG. 2, raising the voltage on lines 220*i* and 220*iii* will affect neighboring memory rows. For example, line 220*i* shares a fringe capacitance junction with an anode 210*iii* of a memory cell in the adjacent row. Similarly, line 220*iii* shares fringe capacitance junction with an anode 210*iv* of a memory cell in the row adjacent line 220*iii*. However, the corresponding neighboring memory cells having anodes 210*iii* and 210*iv* are not programmed because the overall capacitive coupling to the cell being programmed is four times greater. In other words, because there are four times as many fringe capacitance junctions for cell 205, the capacitive coupling into the floating gates corresponding to anodes 210iii and 210iv will be one-fourth that experienced with cell 205. Thus cell 205 is programmed yet the neighboring cells remain unaffected.

Erasing a row of memory cells occurs in a complementary fashion in that the desired row's metal lines are grounded while the corresponding erase lines are coupled to the programming voltage source. Electrons will then tunnel from the floating gates into the sources of the floating gate transistors. Undesirable coupling between the floating gates and the erase lines is minimized because the corresponding floating gate transistors are in a cutoff mode during the erase operation. Should all the erase lines for a given row be raised to the programming voltage during an erase operation, then all the cells on that row will be erased. Conversely, if the contents of some of the memory cells are not to be erased, the corresponding erase lines should be kept at a low or intermediate voltage during the erase operation such that a selective erase operation can be achieved. The metal lines for rows that are not being erased should be kept at an intermediate voltage so that the memory cells in these rows will not be erased regardless of the state of the corresponding erase lines.

To read the contents of a row of memory cells corresponding to a given wordline, the wordline is raised to a sufficient voltage so as to turn on the corresponding select gate transistor. The cells connected to the word line may then be read by sensing the resistance between the corresponding erase lines and bit lines. An erased cell will have a high voltage on its floating gate and therefore a low resistance across the floating gate transistor. Conversely, a programmed cell will have a low voltage on its floating gate floating gate and therefore a high resistance across the floating gate transistor.

Referring again to FIG. 3, the fringe capacitance may be increased through "crowding" of the vias (each via being denoted by a "X") such that semiconductor fab design rules may be violated. In other words, the vias are placed immediately adjacent each other and also the width of each via is adjusted so that it matches the width of the anodes and metal lines. Although design rules may be violated to produce vias of such width, thereby resulting in voids internally to the vias, such voids will have no real effect because of the very small currents that flow through each metal layer capacitor. The vias effectively form a "via wall" such that the fringe capacitance is significant even between metal layers, thereby enhancing the coupling to the floating gate.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A memory array, comprising:
    a substrate including diffusion regions for a plurality of floating gate transistors; the floating gate transistors being arranged in rows;
    a middle metal conductor extending along each row; each middle metal conductor being defined in at least one metal layer adjacent the substrate; and
    a shared metal conductor extending between each pair of adjacent rows, each shared metal conductor being defined in the at least one metal layer;
    wherein each floating gate transistor has a gate coupled to a capacitor, each capacitor including two anode plates being defined in the at least one metal layer, the two anode plates sandwiching the middle metal conductor corresponding to the floating gate transistor's row, each capacitor having three cathodes formed by the sandwiched middle conductor and a pair of shared metal conductors adjacent to the floating gate transistor's row.

2. The memory array of claim 1, wherein for each row, the middle metal conductor and the shared metal conductors are defined in a plurality of metal layer coupled together by vias.

3. The memory array of claim 2, wherein for each row, the anode plates are defined in a plurality of metal layers coupled together by vias.

4. The memory array of claim 3, wherein each floating gate transistor is arranged in a corresponding memory cell including a select gate transistor, the memory cells in each row being arranged in pairs such that each select gate transistor in each pair couples to a common bit line.

5. The memory array of claim 4, further comprising a first word line and a second word line for each row, the first word line being coupled to a select gate for a first select gate transistor in each pair, the second word line being coupled to a select gate for a remaining second select gate transistor in each pair.

6. The memory array of claim 1, wherein each anode plate is substantially rectangular.

7. A method of programming an NMOS non-volatile memory having an array of memory cells arranged in rows, each memory cell having a floating gate transistor including a terminal coupled to an erase line, wherein a middle metal conductor extends along each row; each middle metal conductor being defined in at least one metal layer adjacent a substrate; and wherein a shared metal conductor extends between each pair of adjacent rows, each shared metal conductor being defined in the at least one metal layer, and wherein each floating gate transistor has a gate coupled to a capacitor, each capacitor including two anode plates being defined in the at least one metal layer, the two anode plates sandwiching the middle metal conductor corresponding to the floating gate transistor's row, each capacitor having three cathodes formed by the sandwiched middle conductor and a pair of shared metal conductors adjacent to the floating gate transistor's row, comprising:
    for a given memory cell, grounding the erase line coupled to the memory cell's floating gate transistor; and
    for a row including the given memory cell, charging the row's middle metal conductor and the pair of shared metal conductors adjacent to the row to a positive programming voltage such that the given memory cell is programmed.

8. The method of claim 7, further comprising erasing the programmed non-volatile memory cell by grounding the row's middle metal conductor and the pair of shared metal conductors and charging the erase line to the positive programming voltage.

* * * * *